(12) United States Patent
Nguyen et al.

(10) Patent No.: US 10,521,877 B2
(45) Date of Patent: Dec. 31, 2019

(54) APPARATUS AND METHOD FOR SPECULATIVE BUFFER RESERVATIONS WITH CANCELLATION MECHANISM

(71) Applicant: Samsung Electronics Co., Ltd., Gyeonggi-do (KR)

(72) Inventors: Lam V. Nguyen, Cupertino, CA (US); Michael Butler, San Jose, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/684,351

(22) Filed: Aug. 23, 2017

(65) Prior Publication Data
US 2018/0342040 A1 Nov. 29, 2018

Related U.S. Application Data

(60) Provisional application No. 62/509,889, filed on May 23, 2017.

(51) Int. Cl.
*G06T 1/60* (2006.01)
*G06T 1/20* (2006.01)
*G06T 15/00* (2011.01)
*G06F 17/50* (2006.01)

(52) U.S. Cl.
CPC ............ *G06T 1/20* (2013.01); *G06F 17/5045* (2013.01); *G06T 1/60* (2013.01); *G06T 15/005* (2013.01)

(58) Field of Classification Search
CPC .......... G06T 15/005; G06T 1/20; G06T 1/60; G06T 15/405; G06T 15/10; G06T 15/30; G06T 7/60
See application file for complete search history.

(56) References Cited

U.S. PATENT DOCUMENTS

| 6,961,065 | B2 | 11/2005 | Sasaki |
| 8,817,031 | B2 | 8/2014 | Hakura et al. |
| 9,064,324 | B2 | 6/2015 | Ooguni |
| 9,142,060 | B2 | 9/2015 | Madani et al. |

(Continued)

FOREIGN PATENT DOCUMENTS

| EP | 1138023 | 10/2001 |
| WO | WO 00/30040 | 5/2000 |

*Primary Examiner* — Hau H Nguyen
(74) *Attorney, Agent, or Firm* — The Farrell Law Firm, P.C.

(57) ABSTRACT

An apparatus, a method, a method of manufacturing and apparatus, and a method of constructing an integrated circuit are provided. The apparatus includes a reservation logic device that receives a plurality of primitive types in a data pipeline, wherein the plurality of primitive types includes a binning (BIN) primitive and a setup (SU) primitive; a combinatorial logic device connected to the reservation logic device; an allocation logic device connected to the combinatorial logic device; a plurality of BIN buffers connected to the reservation logic device and the allocation logic device; and a plurality of SU buffers connected to the reservation logic device and the allocation logic device, wherein the allocation logic device determines whether a primitive type is allocated to a BIN buffer or a SU buffer, wherein the reservation logic device requests a reservation of one of the plurality of BIN buffers and the plurality SU buffers based on a corresponding indication of available BIN buffers and available SU buffers and the primitive type.

10 Claims, 5 Drawing Sheets

(56) References Cited

U.S. PATENT DOCUMENTS

| | | |
|---|---|---|
| 9,378,534 B2 | 6/2016 | Krig et al. |
| 10,008,029 B2 * | 6/2018 | Amsinck ............... G06T 15/405 |
| 2014/0118375 A1 * | 5/2014 | Abdalla ................. G06T 17/20 |
| | | 345/545 |
| 2014/0168242 A1 * | 6/2014 | Kubisch ................ G06T 15/005 |
| | | 345/522 |

* cited by examiner

APPARATUS AND METHOD FOR SPECULATIVE BUFFER RESERVATIONS WITH CANCELLATION MECHANISM

PRIORITY

This application claims priority under 35 U.S.C. § 119(e) to a U.S. Provisional Patent Application filed on May 23, 2017 in the United States Patent and Trademark Office and assigned Ser. No. 62/509,889, the entire contents of which are incorporated herein by reference.

FIELD

The present disclosure relates generally to a graphics processing unit (GPU), and more particularly, to an apparatus and method for speculative buffer reservation with a cancellation mechanism.

BACKGROUND

A graphics processing unit (GPU) includes at least one graphics pipeline that determines steps to render a three-dimensional (3D) scene to a two-dimensional (2D) scene. Clipping is a method to selectively enable or disable rendering operations within a defined region of interest. A primitive may be culled by not fetching, transforming, rasterizing or shading the primitive if a graphic object is determined to be invisible. A viewport is a polygon viewing region that outputs an image to a target area of a screen.

Multiple primitive types are typically processed. A conventional method of processing multiple primitive types is to allow a stall of a single virtual channel to block all channels, which sacrifices bandwidth and creates unwanted cross-channel blocking. Another conventional method is to design independent stall mechanisms each with per-channel bypassing at each pipe stage. If a first virtual channel is stalled, intermediate data at each pipe is typically held in a designated local buffer until the stall goes away while the data path continues to process primitives on a second virtual channel, which results in significant hardware costs as the number of channels and the depth of the pipeline increases. Another conventional method is to include arbitration logic at each pipe stage to determine which type of work-item to process next.

SUMMARY

According to one embodiment, an apparatus includes a reservation logic device that receives a plurality of primitive types in a data pipeline, wherein the plurality of primitive types includes a binning (BIN) primitive and a setup (SU) primitive; a combinatorial logic device connected to the reservation logic device; an allocation logic device connected to the combinatorial logic device; a plurality of BIN buffers connected to the reservation logic device and the allocation logic device; and a plurality of SU buffers connected to the reservation logic device and the allocation logic device, wherein the allocation logic device determines whether a primitive type is allocated to a BIN buffer or a SU buffer, wherein the reservation logic device requests a reservation of one of the plurality of BIN buffers and the plurality SU buffers based on a corresponding indication of available BIN buffers and available SU buffers and the primitive type.

According to one embodiment, a method includes receiving, by an input stage of a plurality of stages in which a plurality of virtual channels are formed, a primitive and accept the primitive based on an available buffer; if the primitive is accepted and received at the input stage, reserve a location in the corresponding buffer in the output stage; if the primitive does not satisfy an exit condition, store the primitive in the reserved location of the corresponding buffer; if the primitive satisfies an exit condition, deleting the reserved location in the corresponding buffer; and if data in corresponding buffer is output to corresponding receiving device, increment the number of available locations in the corresponding buffer.

According to one embodiment, a method of manufacturing an apparatus includes forming the apparatus on a wafer or a package with at least one other apparatus, wherein the apparatus includes at least one reservation device, at least one combinatorial logic device, an allocation logic device, an output buffer for a BIN device, an output buffer for an SU device, a BIN device, and an SU device, and testing the apparatus, wherein testing the apparatus includes testing the apparatus using one or more electrical to optical converters, one or more optical splitters that split an optical signal into two or more optical signals, and one or more optical to electrical converters.

According to one embodiment, a method of constructing an integrated circuit includes generating a mask layout for a set of features for a layer of the integrated circuit, wherein the mask layout includes standard cell library macros for one or more circuit features that include an apparatus that includes at least one reservation device, at least one combinatorial logic device, an allocation device, an output buffer for a BIN device, an output buffer for an SU device, a BIN device, and an SU device; disregarding relative positions of the macros for compliance to layout design rules during the generation of the mask layout; checking the relative positions of the macros for compliance to layout design rules after generating the mask layout; upon detection of non-compliance with the layout design rules by any of the macros, modifying the mask layout by modifying each of the noncompliant macros to comply with the layout design rules; generating a mask according to the modified mask layout with the set of features for the layer of the integrated circuit; and manufacturing the integrated circuit layer according to the mask.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
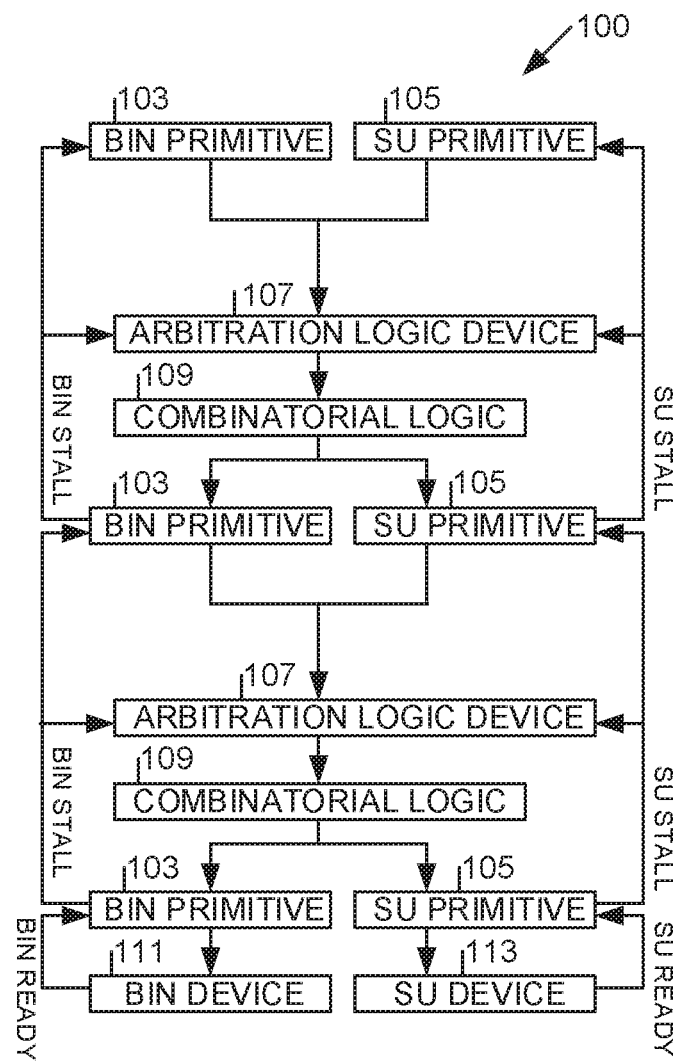
FIG. 1 is a block diagram of an apparatus for processing multiple primitive types.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

FIG. 1 illustrates an exemplary diagram of an apparatus 100 for processing multiple primitive types.

Referring to FIG. 1, the apparatus 100 includes a BIN primitive 103 and an SU primitive 105 or stream-out (SO) device that provides input primitives to an arbitration logic device 107.

The arbitration logic device 107 decides whether to process the BIN primitive or the SU primitive in the next clock cycle. The arbitration logic device 107 includes information that indicates which channel is stalled. If BIN is stalled, the arbitration logic device 107 only allows the SU primitive to flow to the next combinatorial logic 109. The arbitration logic device 107 decides whether a BIN primitive or an SU primitive is transferred to the next combinatorial logic 109. If SU STALL is true, then the arbitration logic device 107 blocks an SU primitive and allows only a BIN primitive to be transferred downstream. The apparatus 100 provides a single data path inside the combinatorial logic 107 that processes and produces both primitive types for the arbitration logic device 107 to minimize area. The apparatus 100 allows independent streams of work to share a single physical pipeline. The pipelines also have an exit condition combinatorial logic 109 for determining if a work item flowing through the pipeline is no longer needed and should be discarded. For example, a primitive that is culled is no longer needed. The apparatus 100 includes a dedicated buffer for each virtual channel at every pipe stage, a stall mechanism at each pipe stage, and arbitration logic at each pipe stage to determine which type of work item to process next. If an individual virtual channel stalls (e.g., due to back-pressure from a downstream device) in the apparatus 100, the other virtual channels can proceed through the pipeline, because the arbitration logic will select the non-stalled primitives for the next cycle based on STALL feedback (SU-STALL or BIN-STALL).

Figure 2:
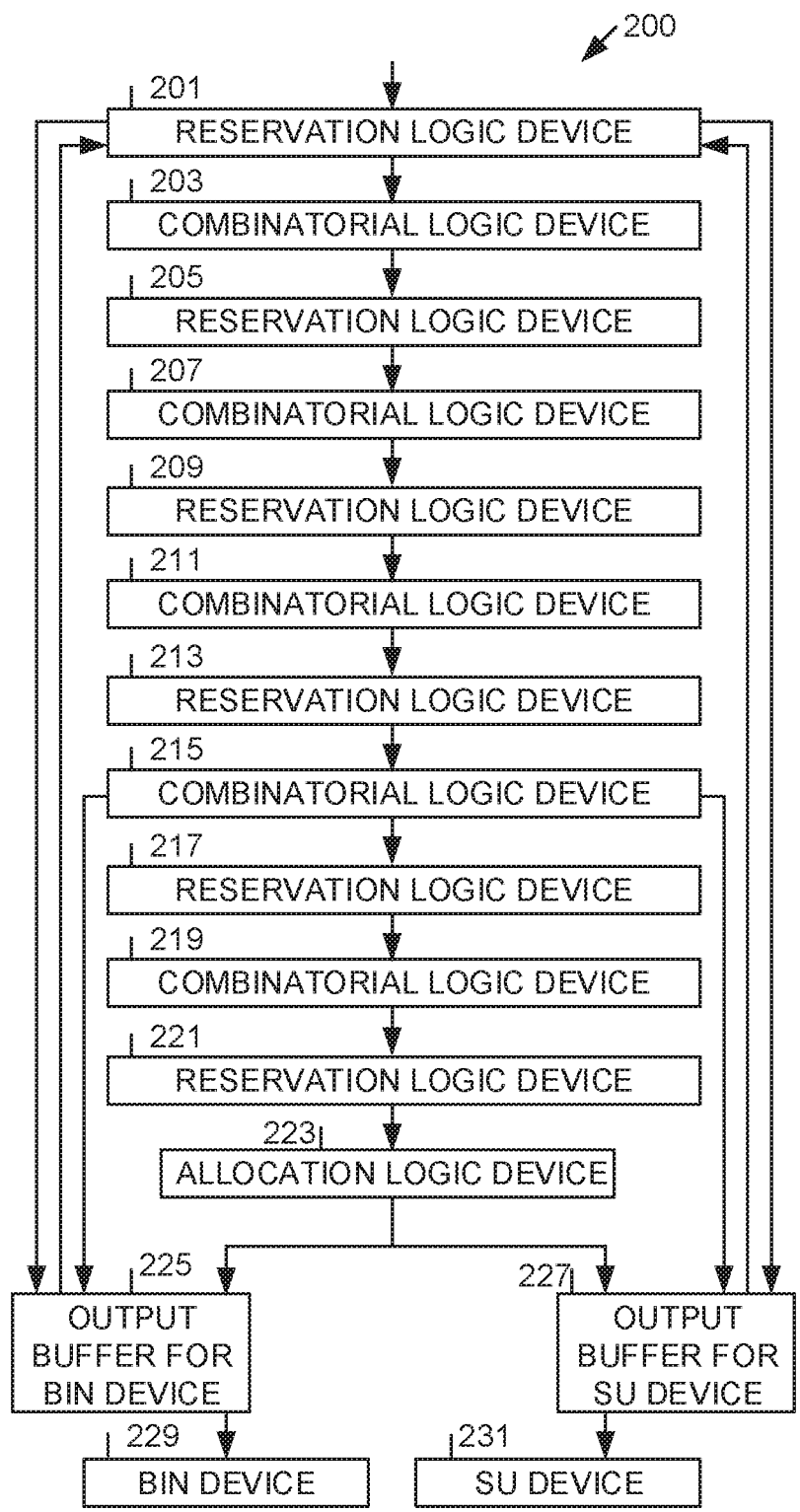
FIG. 2 is a block diagram of an apparatus for processing multiple primitive types, according to one embodiment.

FIG. 2 is a block diagram of an apparatus 200 for processing multiple primitive types, according to one embodiment.

Referring to FIG. 2, the apparatus 200 includes a plurality of reservation devices 201, 205, 209, 213, 217, and 221, a plurality of combinatorial logic devices 203, 207, 211, 215, and 219, an allocation logic device 223, an output buffer for BIN device 225, an output buffer for SU device 227, a BIN device 229, and an SU device 231. The allocation logic device 223 decides if a primitive received at its input should be written to the output buffer for BIN device 225 or the output buffer for SU device 227. The allocation logic device 223 looks at the type of incoming primitive to make the selection. The allocation logic device 223 identifies if a primitive that comes out of the reservation logic device 221 is a BIN primitive or an SU primitive. If the primitive is a BIN primitive, the BIN primitive is written into output buffer for BIN device 225. If the primitive is an SU primitive, the SU primitive is written into the output buffer for SU device 227. The combinatorial logic devices 203, 207, 211, and 219 are regular combinatorial logic devices, and combinatorial logic device 215 determines if a work item flowing through the pipeline is no longer needed and should be discarded. While FIG. 2 illustrates six reservation devices 201, 205, 209, 213, 217, and 221 and five combinatorial logic devices 203, 207, 211, 215, and 219, the present disclosure is not limited thereto, and any number of reservation logic devices and combinatorial logic devices may be used.

The first reservation device 201 includes a first input for receiving a work item, a second input for receiving a number of available BIN buffer locations, a third input for receiving a number of available SU buffer locations, a first output for reserving an available BIN buffer location, a second output for reserving an available SU buffer location, and a third output for transmitting either a BIN primitive or an SU primitive. The first input and the third output of the first reservation device 201 is a single data path in a pipeline for processing different types of work items (e.g., BIN primitive and SU primitive work items) in a virtual channel.

The single data path allows a mix of different types of work items to flow through the pipeline. If there is at least one buffer location available in the output buffer of the same type as a work item received at the first input of the first reservation device 201 (e.g., the received work item is a BIN primitive and there is an available buffer location in the output buffer for BIN device 225 or the received work item is an SU primitive and there is an available buffer location in the output buffer for SU device 227) then the work item is accepted by the first reservation device 201.

If some data of a received work item has nothing to do with clipping or culling, (e.g., a vertex identifier (ID)), meta-data is forwarded directly to the output buffer that corresponds to the type of the received work item (e.g., if the work item in a BIN primitive then the data that has nothing to do with clipping or culling is forwarded directly to the output buffer for BIN device 225, and if the work item in an SU primitive then the data that has nothing to do with clipping or culling is forwarded directly to the output buffer for SU device 227) to avoid processing through the pipeline.

The first reservation device 201 includes a reservation device for reserving an available buffer location for a new work item in an output buffer of the same type as the work item. That is, if the work item in a BIN primitive then the first reservation device 201 reserves an available buffer location in the output buffer for BIN device 225, and if the work item in an SU primitive then the first reservation device 201 reserves an available buffer location in the output buffer for SU device 227.

The first combinatorial logic device 203 includes an input connected to the third output of the first reservation device 201, and an output. The first reservation device 201 and the first combinatorial logic device 203 form a first pipe in the single-data-path pipeline. While FIG. 2 illustrates 5 pipes in the pipeline, the present disclosure is not limited thereto, and the present disclosure may include any number of pipes in the pipeline. The first pipe formed by the first reservation device 201 and the first combinatorial logic device 203 does not include a local stall mechanism or an arbitration mechanism as does the conventional apparatus 100 illustrated in FIG. 1. In FIG. 2, when a virtual channel stalls, other work items may proceed through the pipeline.

The second reservation device 205 includes an input connected to the output of the first combinatorial logic device 203, and an output for transmitting either a BIN primitive or an SU primitive. The input and the output of the second reservation device 205 is a single data path in a pipeline for processing different types of work items (e.g., BIN primitive and SU primitive work items) in a virtual channel.

The second combinatorial logic device 207 includes an input connected to the output of the second reservation device 205, and an output. The second reservation device 205 and the second combinatorial logic device 207 form a second pipe in the single-data-path pipeline. The second pipe formed by the second reservation device 205 and the second combinatorial logic device 207 does not include a local stall mechanism or an arbitration mechanism as does the conventional apparatus 100 illustrated in FIG. 1.

The third reservation device 209 of FIG. 2 includes an input connected to the output of the second combinatorial logic device 207, and an output for transmitting either a BIN primitive or an SU primitive. The input and the output of the third reservation device 209 is a single data path in a pipeline for processing different types of work items (e.g., BIN primitive and SU primitive work items) in a virtual channel.

The third combinatorial logic device 211 includes an input connected to the output of the third reservation device 209, and an output. The third reservation 209 and the third combinatorial logic device 211 form a third pipe in the single-data-path pipeline. The third pipe formed by the third reservation device 209 and the third combinatorial logic device 211 does not include a local stall mechanism or an arbitration mechanism as does the conventional apparatus 100 illustrated in FIG. 1.

The fourth reservation device 213 of FIG. 2 includes an input connected to the output of the third combinatorial logic device 211, and an output for transmitting either a BIN primitive or an SU primitive. The input and the output of the fourth reservation device 213 is a single data path in a pipeline for processing different types of work items (e.g., BIN primitive and SU primitive work items) in a virtual channel.

The fourth combinatorial logic device 215 includes an input connected to the output of the fourth reservation device 213, a first output connected to the output buffer for BIN device 225 for deleting a BIN reservation previously made in the output buffer for BIN device 225, a second output connected to the output buffer for SU device 227 for deleting a SU reservation previously made in the output buffer for SU device 227, and a third output. The fourth reservation device 213 and the fourth combinatorial logic device 215 form a fourth pipe in the single-data-path pipeline. The fourth pipe formed by the fourth reservation device 213 and the fourth combinatorial logic device 215 does not include a local stall mechanism or an arbitration mechanism as does the conventional apparatus 100 illustrated in FIG. 1.

A work item's reservation is deleted from the corresponding output buffer (e.g., the output buffer for BIN device 225 and the output buffer for SU device 227) if an exit condition concerning the work item is satisfied. Thus, a work item that satisfies an exit condition is tracked, and its corresponding reservation is deleted, and processing on the work item is stopped as soon as the exit condition is satisfied.

The fifth reservation device 217 of FIG. 2 includes an input connected to the third output of the fourth combinatorial logic device 215, and an output for transmitting either a BIN primitive or an SU primitive. The input and the output of the fifth reservation device 217 is a single data path in a pipeline for processing different types of work items (e.g., BIN primitive and SU primitive work items) in a virtual channel.

The fifth combinatorial logic device 219 includes an input connected to the output of the fifth reservation device 217, and an output. The fifth reservation device 217 and the fifth combinatorial logic device 219 form a fifth pipe in the single-data-path pipeline. The fifth pipe formed by the fifth reservation device 217 and the fifth combinatorial logic device 219 does not include a local stall mechanism or an arbitration mechanism as does the conventional apparatus 100 illustrated in FIG. 1.

The sixth reservation device 221 of FIG. 2 includes an input connected to the output of the fifth combinatorial logic device 219, and an output for transmitting either a BIN primitive or an SU primitive. The input and the output of the sixth reservation device 221 is a single data path in a pipeline for processing different types of work items (e.g., BIN primitive and SU primitive work items) in a virtual channel.

The allocation logic device 223 includes an input connected to the output of the sixth reservation device 221, and an output. The sixth reservation device 221 and the allocation logic device 223 form a sixth and last pipe in the single-data-path pipeline of FIG. 2. However, the present disclosure is not limited to six pipes, and any number of pipes may be included in an embodiment of the present disclosure.

The output buffer for BIN device 225 includes a first input connected to the first output of the first reservation device 201 for receiving a request to reserve a BIN buffer location for a work item, a second input connected to the first output of the fourth combinatorial logic device 215 for receiving a request to delete a previously reserved BIN buffer location, a third input connected to the output of the allocation logic device 223, a first output connected to the second input of the first reservation device 201 for indicating a number of BIN buffer locations that are available, and a second output.

The output buffer for SU device 227 includes a first input connected to the second output of the first reservation device 201 for receiving a request to reserve an SU buffer location for a work item, a second input connected to the second output of the fourth combinatorial logic device 215 for receiving a request to delete a previously reserved SU buffer location, a third input connected to the output of the allocation logic device 223, a first output connected to the third input of the first reservation device 201 for indicating a number of SU buffer locations that are available, and a second output.

The output buffer for BIN device 225 and the output buffer for SU device 227 are placed at the output of the final pipe stage and are speculative buffers for each virtual channel. The apparatus 200 of FIG. 2 can process multiple virtual channels, where a single data path processes different types of work items. An exit condition is used to determine if a work item is no longer needed. For example culling a graphic may be an exit condition. The number of buffer locations in each of the output buffer for BIN device 225 and the output buffer for SU device 227 may be varied to match a bandwidth of up-stream or down-stream devices.

The BIN device 229 includes an input connected to the output of the output buffer for BIN device 225. The SU device 231 includes an input connected to the output of the output buffer for SU device 227.

According to one embodiment, the present system includes a CCV device that receives input primitives from an SO device and delivers the result to either a BIN device or an SU device. The present system provides a single data path inside the CCV that processes and produces both primitive types for the receiving BIN and SU to minimize area. The present system allows independent streams of work to share a single physical pipeline. The pipelines also have an exit condition that determines whether a work item flowing through the pipeline is no longer needed and should be discarded. For example, a primitive that is culled is no longer needed. When an individual virtual channel stalls (e.g., due to back-pressure from a downstream unit), it is advantageous to allow the other virtual channels to proceed through the pipeline.

According to one embodiment, the present system includes a single pipeline that can process different types of work items. The present system includes one or more speculative buffers that are placed at the output of the pipeline (final pipe stage) and a reservation mechanism is used to manage the speculative buffers and allow other work items to flow through the pipeline when an item is stalled due to push-back from a receiving unit (e.g., BIN, SU). The reservation mechanism may be in the form of logic that is embedded within the speculative buffer. The reservation mechanism may be used at the end of a clipper output where the output of the clipper is known (this pipeline may be referred to as a primitive pipeline) to manage the push-back from SU/BIN devices.

According to one embodiment, a reservation mechanism may be used in a vertex pipeline. For example, a work-item that enters a vertex pipeline may request three slots if it is a new triangle (wrnRd=111); two slots if one of the vertices is a reused vertex (wrnRd=011); and one slot if two of vertices are reused vertices (wrnRd=001).

According to one embodiment, the system discards a work-item's reservation if the work-item's exit condition is satisfied (e.g., the work-item's exit condition is true). The system accepts a work-item to the pipeline if there is at least one speculative buffer available. If one type of work-item is stalled, another work-item proceeds through the pipeline. Furthermore, the number of buffers may be adjusted. For example, some data of a work-item that has nothing to do with cull/clipping (e.g., a vertex identifier (ID), meta-data) may be forwarded directly to the work-item's buffer to avoid processing them through the pipeline.

According to one embodiment, the present system includes a primitive data path in a CCV. The primitive data path begins after a clip condition is known and ends at a final output stage of the CCV. The present system allocates two first-in-first-out (FIFO) registers or buffers at the final pipe stage one for each virtual channel. Each buffer holds a distinct primitive that is ready to be sent to the designated receiving unit. A primitive that enters the primitive data path may be culled due to cull conditions such as scissoring cull, area-equal-zero cull and many other culls. To manage these buffers and properly handle all cull conditions, four local variables may be introduced for each FIFO:

NumberBufferAvailable indicates a number of locations in a buffer at an output stage that are empty;

RequestReservation is asserted when a primitive is received at an input stage;

RequestReservation reserves one of the locations in the designated buffer;

NumberReservation indicates a number of pending reservations; and

DeleteReservation is asserted to remove the primitive's reservation if an exit condition of a primitive is satisfied (e.g., a primitive is culled).

The number of available buffers (NumberBufferAvailable) may be determined based on Equation (1) as follows:

NumberBufferAvailable=FIFO's depth−(number of buffers that contain valid data)−NumberReservation (1)

According to an embodiment, more than two different work items may be processed. For example, three different work items (e.g., BIN/SU/RASZ) may be processed, which only requires add one more buffer for RASZ. The RASZ buffer may be similar to the BIN/SU output buffers. The data-path elements (e.g., combinatorial logic devices 203, 207, 211, 215, 219) may also be modified to process three different work items (e.g., BIN/SU/RASZ primitives).

Figure 3:
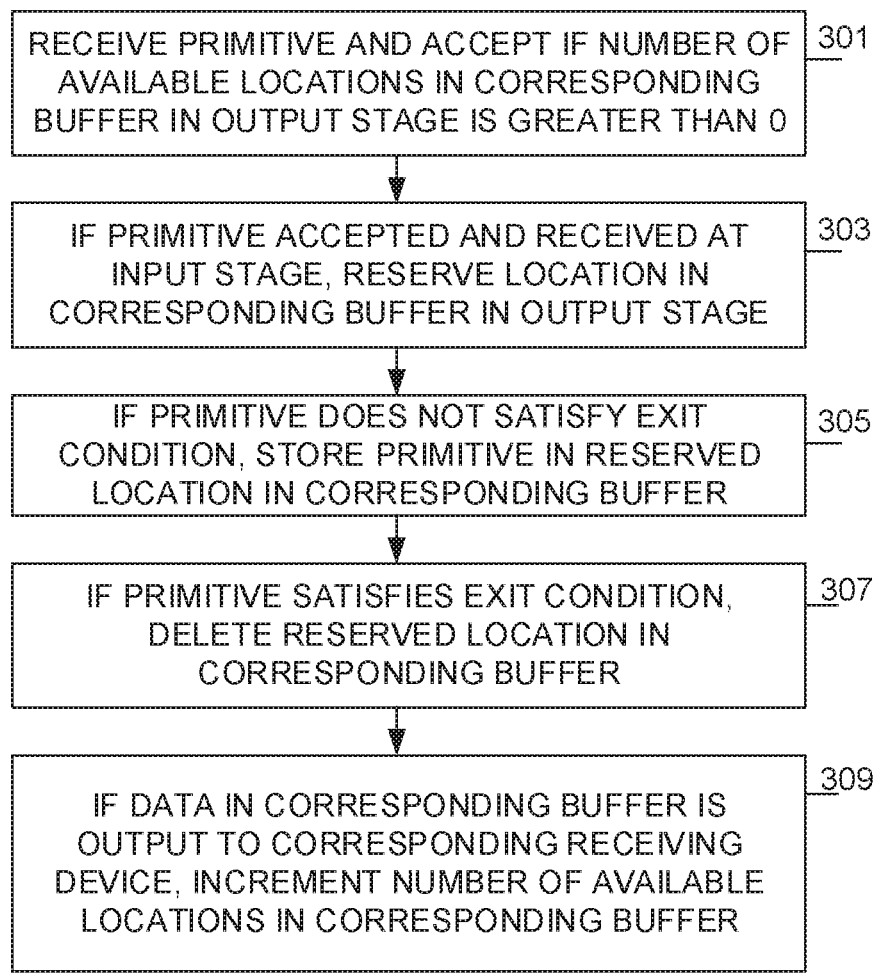
FIG. 3 illustrates an exemplary flowchart of a method of processing multiple primitive types, according to one embodiment.

FIG. 3 illustrates an exemplary flowchart of a method of processing multiple primitive types, according to one embodiment.

Referring to FIG. 3, an input primitive (e.g., BIN primitive or SU primitive) is received, by a CCV, for a virtual channel and is accepted only if a corresponding number of available buffer locations (NumberBufferAvailable) of the virtual channel (e.g., number of BIN buffer locations or number of SU buffer location) is greater than zero at 301.

At 303, if the input primitive is accepted and arrives at an input stage, a corresponding buffer location (e.g., BIN buffer location or SU buffer location) is reserved at an output stage by making a reservation request (RequestReservation) at 303. The reservation request increments the corresponding number of reservations (NumberReservation) (e.g., number of BIN buffer reservations or number of SU buffer reservations), and decrements the corresponding number of available buffer locations (NumberBufferAvailable) (e.g., number of BIN buffer locations or number of SU buffer locations) in accordance with Equation (1) above, if neither a BIN device (e.g., binning device 229 in FIG. 2) or an SU device (e.g., set up device 231 in FIG. 2) consumes one of the items of a corresponding FIFO (e.g., output buffer for BIN device 225 or output buffer for SU device 227 in FIG. 2), respectively, at the same time.

At 305, if the input primitive of the virtual channel does not satisfy an exit condition (e.g., cull, etc.), the input primitive is written to or stored at a corresponding buffer location (e.g., BIN buffer location or SU buffer location) of a designated FIFO (e.g., output buffer for BIN device 225 or output buffer for SU device 227 in FIG. 2), the corresponding number of reservations (NumberReservation) is decremented (e.g., number of BIN reservations or number of SU reservations), and the corresponding number of buffer locations (e.g., number of BIN buffer locations or number of SU buffer locations) that contain valid data is incremented, if neither a BIN device (e.g., binning device 229 in FIG. 2) or an SU device (e.g., set up device 231 in FIG. 2) consumes one of the items of a corresponding FIFO (e.g., output buffer for BIN device 225 or output buffer for SU device 227 in FIG. 2), respectively, at the same time. Thus, the corresponding number of available buffer locations (NumberBufferAvailable) stays the same (e.g., available BIN buffer locations or available SU buffer locations).

At 307, if an exit condition is satisfied (e.g., cull, etc.), a corresponding delete reservation (DeleteReservation) is asserted (e.g., delete BIN reservation or delete SU reservation), the corresponding number of reservations (NumberReservation) is decremented (e.g., BIN reservations or SU reservations), and the corresponding number of available buffer locations (NumberBufferAvailable) is incremented (e.g., available BIN buffer locations or available SU buffer locations) in accordance with Equation (1) above, if neither a BIN device (e.g., binning device 229 in FIG. 2) or an SU device (e.g., set up device 231 in FIG. 2) consumes one of the items of a corresponding FIFO (e.g., output buffer for BIN device 225 or output buffer for SU device 227 in FIG. 2), respectively, at the same time.

At 309, if data in one of the corresponding FIFOs (e.g., output buffer for BIN device 225 or output buffer for SU device 227 in FIG. 2) is output to a designated receiving device (e.g., binning device 229 or set up device 231 in FIG. 2), the corresponding number of available buffer locations (NumberBufferAvailable) is incremented (e.g., BIN buffer locations or SU buffer locations), because the number of buffer locations that contain valid data is decremented.

If an SU work item is received, a number of available SU buffers (NumberSUBufferAvailable) is determined. If NumberSUBufferAvailable is greater than or equal to one, the SU work-item proceeds to reserving an SU buffer location (RequestSUReservation). Similarly, if a BIN work-item is received, a number of available BIN buffer locations (NumberBINBufferAvailable) is determined. If NumberBINBufferAvailable is greater than or equal to one, the work-item proceeds to reserving a BIN buffer location (RequestBINReservation).

If a reservation of a buffer location is made, a corresponding buffer reservation request (RequestSUReservation or RequestBINReservation) is asserted. In a next clock cycle, a corresponding NumberSUBufferAvailable or NumberBINBufferAvailable is updated according to Equation (1) above. Then, NumberSUBufferAvailable or NumberBINBufferAvailable is decremented by 1 if neither an SU nor a BIN consumes one of the items of an output buffer for the SU or an output buffer for the BIN, respectively, at the same time.

If an exit condition for a work-item is satisfied, a delete buffer reservation request (DeleteSUReservation or DeleteBINReservation) is made. In the next clock cycle, the corresponding NumberSUBufferAvailable or NumberBINBufferAvailable is updated according to Equation (1) above. In general, NumberSUBufferAvailable or NumberBINBufferAvailable is incremented by 1 if neither an SU nor a BIN consumes one of the items of an output buffer for the SU or an output buffer for the BIN at the same time.

If a work-item is written into an output buffer for BIN or an output buffer for SU respectively, the corresponding NumberSUBufferAvailable or NumberBINBufferAvailable is updated according to Equation (1) above. The variable "number of buffers that contain valid data" of Equation (1) above is incremented and NumberReservation is decremented so NumberSUBufferAvailable or NumberBINBufferAvailable stays the same if neither an SU nor a BIN consumes one of the items of the output buffer for the SU or the output buffer for the BIN at the same time.

If a BIN device or an SU device consumes one of the items of the output buffer for the BIN device or the output buffer for the SU device, in the next clock cycle the variable "number of buffers that contain valid data" of Equation (1) above is decremented so NumberSUBufferAvailable or NumberBINBufferAvailable is incremented if neither a buffer reservation request (RequestSUReservation or RequestBINReservation) is made, nor an exit condition for a work-item is satisfied, nor a work-item is written into an output buffer for BIN or an output buffer for SU occurs at the same time.

According to one embodiment, the present system varies the size of the corresponding FIFOs to match a rate of consumption of a receiving device as well as an arrival rate of primitives to the data path. The maximum size of the corresponding FIFOs may be equal to the number of pipes in the data path. If the arrival rate of primitives to the data path is 2 clock cycles per primitive, the size of the corresponding FIFOs may be reduced by half.

Figure 4:
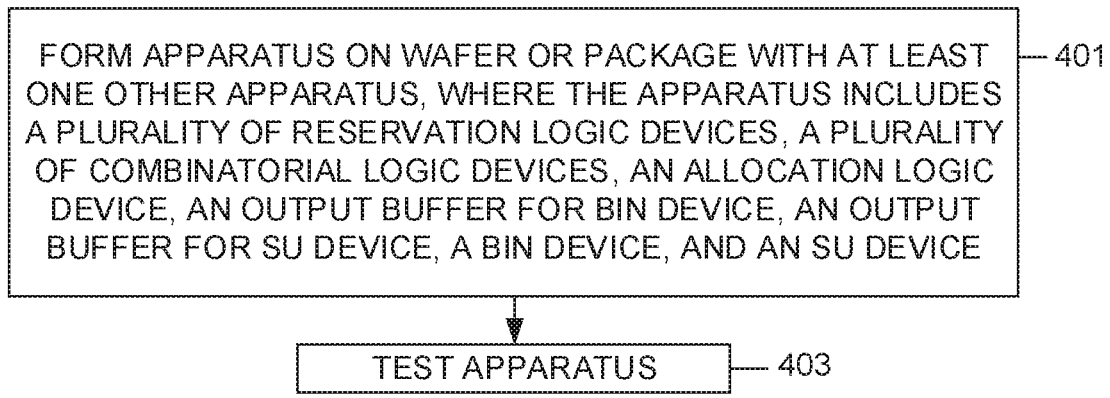
FIG. 4 illustrates an exemplary flowchart of a method of manufacturing an apparatus for processing multiple primitive types, according to one embodiment.

FIG. 4 illustrates an exemplary flowchart of a method of manufacturing an apparatus for processing multiple primitive types, according to one embodiment.

Referring to FIG. 4, an apparatus is formed on a wafer or a package with at least one other apparatus, where the apparatus includes at least one BIN primitive/SU primitive device, at least one combinatorial logic device, an allocation logic device, an output buffer for BIN device, an output buffer for SU device, a BIN device, and an SU device, at 401.

At 403, the apparatus is tested. Testing the apparatus may include testing the apparatus using one or more electrical to optical converters, one or more optical splitters that split an optical signal into two or more optical signals, and one or more optical to electrical converters.

Figure 5:
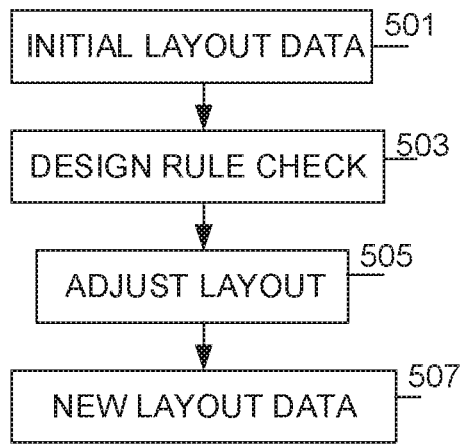
FIG. 5 illustrates an exemplary flowchart of a method of constructing an integrated circuit for processing multiple primitive types, according to one embodiment.

FIG. 5 illustrates an exemplary flowchart of a method of constructing an integrated circuit, according to one embodiment.

Referring to FIG. 5, initial layout data is constructed in 501. For example, a mask layout is generated for a set of features for a layer of the integrated circuit, wherein the mask layout includes standard cell library macros for one or more circuit features that include an apparatus that includes at least one BIN primitive/SU primitive device, at least one combinatorial logic device, an allocation device, an output buffer for BIN device, an output buffer for SU device, a BIN device, and an SU device, and disregarding relative positions of the macros for compliance to layout design rules during the generation of the mask layout.

At 503, a design rule check is performed. For example, the method may check the relative positions of the macros for compliance to layout design rules after generating the mask layout.

At 505, the layout is adjusted. For example, the method, upon detection of noncompliance with the layout design rules by any of the macros, may modify the mask layout by modifying each of the noncompliant macros to comply with the layout design rules.

At 507, new layout data is generated. For example, the method may generate a mask according to the modified mask layout with the set of features for the layer of the integrated circuit. Then, the integrated circuit layer according to the mask may be manufactured.

Figure 6:
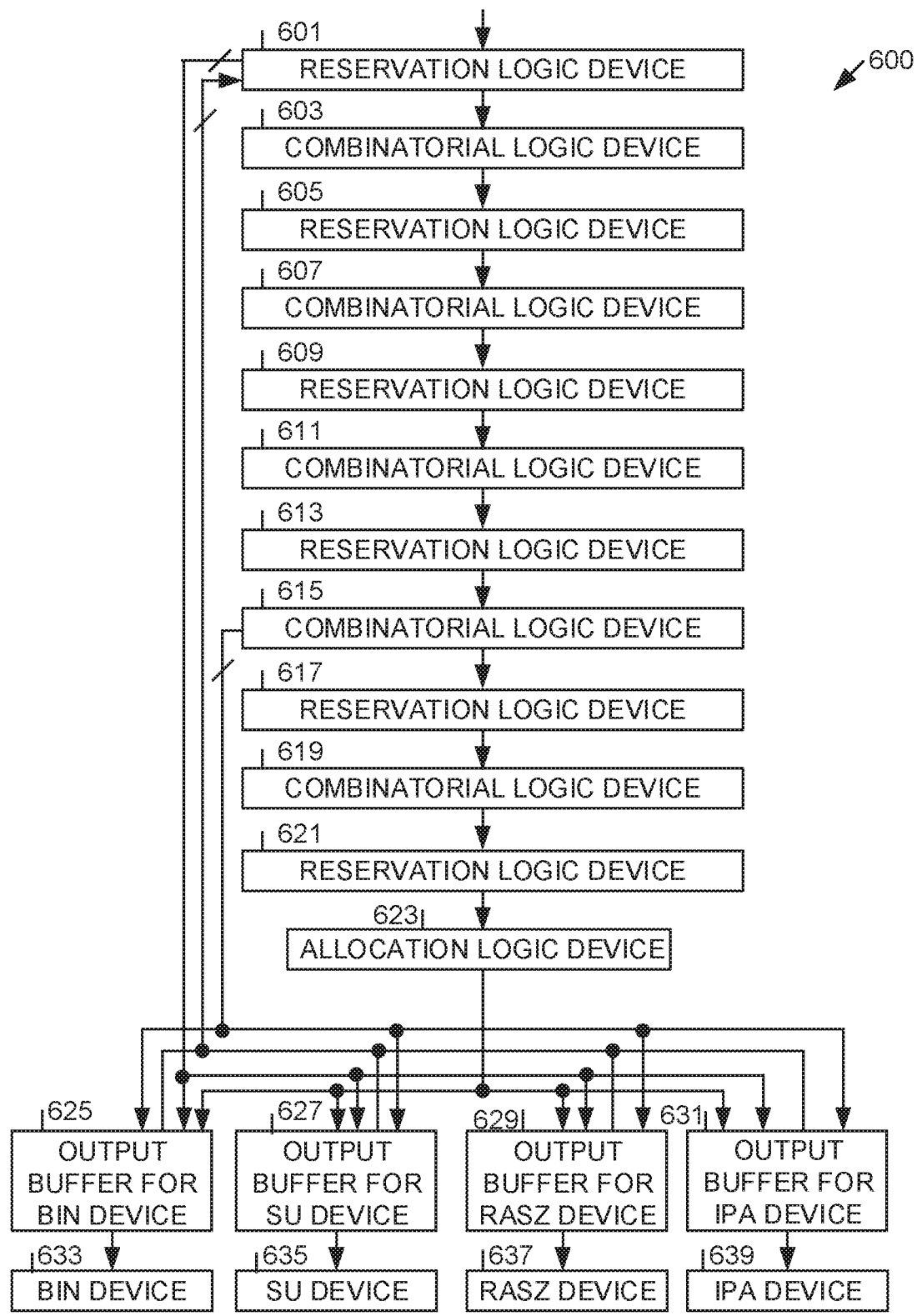
FIG. 6 is a block diagram of an apparatus for processing multiple primitive types, according to one embodiment.

FIG. 6 is a block diagram of an apparatus 600 for processing multiple primitive types, according to one embodiment. For example, FIG. 6 is a block diagram of an apparatus for processing four primitive types, which indicates that the present disclosure can be scaled up easily.

Referring to FIG. 6, the apparatus 600 includes a plurality of reservation devices 601, 605, 609, 613, 617, and 621, a plurality of combinatorial logic devices 603, 607, 611, 615, and 619, an allocation logic device 623, an output buffer for BIN device 625, an output buffer for SU device 627, an output buffer for a rasterization (RASZ) device 629, an output buffer for interpolation (IPA) device 631, a BIN device 633, an SU device 635, an RASZ device 637, and an IPA device 639. The allocation logic device 623 decides if a primitive received at its input should be written to the output buffer for BIN device 625, the output buffer for SU device 627, the output buffer for a RASZ device 629, or the output buffer for IPA device 631. The allocation logic device 623 looks at the type of incoming primitive to make the selection. The allocation logic device 623 identifies if a primitive that comes out of the reservation logic device 621 is a BIN primitive, an SU primitive, a RASZ primitive, or an IPA primitive. If the primitive is a BIN primitive, the BIN primitive is written into output buffer for BIN device 625. If the primitive is an SU primitive, the SU primitive is written into the output buffer for SU device 627. If the primitive is a RASZ primitive, the RASZ primitive is written into the output buffer for RASZ device 629. If the primitive is an IPA primitive, the IPA primitive is written into the output buffer for IPA device 631. The combinatorial logic devices 603, 607, 611, and 619 are regular combinatorial logic devices, and combinatorial logic device 615 determines if a work item flowing through the pipeline is no longer needed and should be discarded. While FIG. 6 illustrates six reservation devices 601, 605, 609, 613, 617, and 621 and five combinatorial logic devices 603, 607, 611, 615, and 619, the present disclosure is not limited thereto, and any number of reservation logic devices and combinatorial logic devices may be used.

The first reservation device 601 includes a first input for receiving a work item, a second input bus for receiving a number of available BIN buffer locations, a number of available SU buffer locations, a number of available RASZ buffer locations, and a number of available IPA buffer locations; a first output bus for reserving an available BIN buffer location, an available SU buffer location, an available RASZ buffer location, and an available IPA buffer location; and a second output for transmitting either a BIN primitive, an SU primitive, a RASZ primitive, or an IPA primitive. The first input and the second output of the first reservation device 601 is a single data path in a pipeline for processing different types of work items (e.g., BIN primitive, SU primitive, RAZS primitive, or IPA primitive work items) in a virtual channel.

The single data path allows a mix of different types of work items to flow through the pipeline. If there is at least one buffer location available in the output buffer of the same type as a work item received at the first input of the first reservation device 601 (e.g., the received work item is a BIN primitive and there is an available buffer location in the output buffer for BIN device 625, the received work item is an SU primitive and there is an available buffer location in the output buffer for SU device 627, the received work item is a RASZ primitive and there is an available buffer location in the output buffer for RASZ device 629, or the received work item is an IPA primitive and there is an available buffer location in the output buffer for IPA device 631) then the work item is accepted by the first reservation device 601.

If some data of a received work item has nothing to do with clipping or culling, (e.g., a vertex ID), meta-data is forwarded directly to the output buffer that corresponds to the type of the received work item (e.g., if the work item in a BIN primitive then the data that has nothing to do with clipping or culling is forwarded directly to the output buffer for BIN device 625, if the work item in an SU primitive then the data that has nothing to do with clipping or culling is forwarded directly to the output buffer for SU device 627, if the work item in a RASZ primitive then the data that has nothing to do with clipping or culling is forwarded directly to the output buffer for RASZ device 629, or if the work item in an IPA primitive then the data that has nothing to do with clipping or culling is forwarded directly to the output buffer for IPA device 631) to avoid processing through the pipeline.

The first reservation device 601 includes a reservation device for reserving an available buffer location for a new work item in an output buffer of the same type as the work item. That is, if the work item in a BIN primitive then the first reservation device 601 reserves an available buffer location in the output buffer for BIN device 625, if the work item in an SU primitive then the first reservation device 601 reserves an available buffer location in the output buffer for SU device 627, if the work item in a RASZ primitive then the first reservation device 601 reserves an available buffer location in the output buffer for RASZ device 629, or if the work item in an IPA primitive then the first reservation device 601 reserves an available buffer location in the output buffer for IPA device 631.

The first combinatorial logic device 603 includes an input connected to the second output of the first reservation device 601, and an output. The first reservation device 601 and the first combinatorial logic device 603 form a first pipe in the single-data-path pipeline. While FIG. 6 illustrates 5 pipes in the pipeline, the present disclosure is not limited thereto, and the present disclosure may include any number of pipes in the pipeline. The first pipe formed by the first reservation device 601 and the first combinatorial logic device 603 does not include a local stall mechanism or an arbitration mechanism as does the conventional apparatus 100 illustrated in FIG. 1. In FIG. 6, when a virtual channel stalls, other work items may proceed through the pipeline.

The second reservation device 605 includes an input connected to the output of the first combinatorial logic device 603, and an output for transmitting either a BIN primitive, an SU primitive, a RASZ primitive, or an IPA primitive. The input and the output of the second reservation device 605 is a single data path in a pipeline for processing different types of work items (e.g., BIN primitive, SU primitive, RASZ primitive, or IPA primitive work items) in a virtual channel.

The second combinatorial logic device 607 includes an input connected to the output of the second reservation device 605, and an output. The second reservation device 605 and the second combinatorial logic device 607 form a second pipe in the single-data-path pipeline. The second pipe formed by the second reservation device 605 and the second combinatorial logic device 607 does not include a local stall mechanism or an arbitration mechanism as does the conventional apparatus 100 illustrated in FIG. 1.

The third reservation device 609 of FIG. 6 includes an input connected to the output of the second combinatorial logic device 607, and an output for transmitting either a BIN primitive, an SU primitive, a RASZ primitive, or an IPA primitive. The input and the output of the third reservation device 609 is a single data path in a pipeline for processing different types of work items (e.g., BIN primitive, SU primitive, RASZ primitive, or IPA primitive work items) in a virtual channel.

The third combinatorial logic device 611 includes an input connected to the output of the third reservation device 609, and an output. The third reservation 609 and the third combinatorial logic device 611 form a third pipe in the single-data-path pipeline. The third pipe formed by the third reservation device 609 and the third combinatorial logic device 611 does not include a local stall mechanism or an arbitration mechanism as does the conventional apparatus 100 illustrated in FIG. 1.

The fourth reservation device 613 of FIG. 6 includes an input connected to the output of the third combinatorial logic device 611, and an output for transmitting either a BIN primitive, an SU primitive, a RASZ primitive, or an IPA primitive. The input and the output of the fourth reservation device 613 is a single data path in a pipeline for processing different types of work items (e.g., BIN primitive, SU primitive, RASZ primitive, or IPA primitive work items) in a virtual channel.

The fourth combinatorial logic device 615 includes an input connected to the output of the fourth reservation device 613, a first output bus connected to the output buffer for BIN device 625 for deleting a BIN reservation previously made in the output buffer for BIN device 625, the output buffer for SU device 627 for deleting an SU reservation previously made in the output buffer for SU device 627, the output buffer for RASZ device 629 for deleting a RASZ reservation previously made in the output buffer for RASZ device 629, and the output buffer for IPA device 631 for deleting an IPA reservation previously made in the output buffer for IPA device 631; and a second output. The fourth reservation device 613 and the fourth combinatorial logic device 615 form a fourth pipe in the single-data-path pipeline. The fourth pipe formed by the fourth reservation device 613 and the fourth combinatorial logic device 615 does not include a local stall mechanism or an arbitration mechanism as does the conventional apparatus 100 illustrated in FIG. 1.

A work item's reservation is deleted from the corresponding output buffer (e.g., the output buffer for BIN device 625, the output buffer for SU device 627, the output buffer for RASZ device 629, or the output buffer for IPA device 631) if an exit condition concerning the work item is satisfied. Thus, a work item that satisfies an exit condition is tracked, and its corresponding reservation is deleted, and processing on the work item is stopped as soon as the exit condition is satisfied.

The fifth reservation device 617 of FIG. 6 includes an input connected to the second output of the fourth combinatorial logic device 615, and an output for transmitting either a BIN primitive, an SU primitive, a RASZ primitive, or an IPA primitive. The input and the output of the fifth reservation device 617 is a single data path in a pipeline for processing different types of work items (e.g., BIN primitive, SU primitive, RASZ primitive, or IPA primitive work items) in a virtual channel.

The fifth combinatorial logic device 619 includes an input connected to the output of the fifth reservation device 617, and an output. The fifth reservation device 617 and the fifth combinatorial logic device 619 form a fifth pipe in the single-data-path pipeline. The fifth pipe formed by the fifth reservation device 617 and the fifth combinatorial logic device 619 does not include a local stall mechanism or an arbitration mechanism as does the conventional apparatus 100 illustrated in FIG. 1.

The sixth reservation device 621 of FIG. 6 includes an input connected to the output of the fifth combinatorial logic device 619, and an output for transmitting either a BIN primitive, an SU primitive, a RASZ primitive, or an IPA primitive. The input and the output of the sixth reservation device 621 is a single data path in a pipeline for processing different types of work items (e.g., BIN primitive, SU primitive, RASZ primitive, or IPA primitive work items) in a virtual channel.

The allocation logic device 623 includes an input connected to the output of the sixth reservation device 621, and an output. The sixth reservation device 621 and the allocation logic device 623 form a sixth and last pipe in the single-data-path pipeline of FIG. 6. However, the present disclosure is not limited to six pipes, and any number of pipes may be included in an embodiment of the present disclosure.

The output buffer for BIN device 625 includes a first input connected to the first output bus of the first reservation device 601 for receiving a request to reserve a BIN buffer location for a work item, a second input connected to the first output bus of the fourth combinatorial logic device 615 for receiving a request to delete a previously reserved BIN buffer location, a third input connected to the output of the allocation logic device 623, a first output connected to the second input bus of the first reservation device 601 for indicating a number of BIN buffer locations that are available, and a second output.

The output buffer for SU device 627 includes a first input connected to the first output bus of the first reservation device 601 for receiving a request to reserve an SU buffer location for a work item, a second input connected to the first output bus of the fourth combinatorial logic device 615 for receiving a request to delete a previously reserved SU buffer location, a third input connected to the output of the allocation logic device 623, a first output connected to the second input bus of the first reservation device 601 for indicating a number of SU buffer locations that are available, and a second output.

The output buffer for RASZ device 629 includes a first input connected to the first output bus of the first reservation device 601 for receiving a request to reserve a RASZ buffer location for a work item, a second input connected to the first output bus of the fourth combinatorial logic device 615 for receiving a request to delete a previously reserved RASZ buffer location, a third input connected to the output of the allocation logic device 623, a first output connected to the second input bus of the first reservation device 601 for indicating a number of RASZ buffer locations that are available, and a second output.

The output buffer for IPA device 631 includes a first input connected to the first output bus of the first reservation device 601 for receiving a request to reserve an IPA buffer location for a work item, a second input connected to the first output bus of the fourth combinatorial logic device 615 for receiving a request to delete a previously reserved IPA buffer location, a third input connected to the output of the allocation logic device 623, a first output connected to the second input bus of the first reservation device 601 for indicating a number of IPA buffer locations that are available, and a second output.

The output buffer for BIN device 625, the output buffer for SU device 627, the output buffer for RASZ device 629, and the output buffer for IPA device 631 are placed at the output of the final pipe stage and are speculative buffers for each virtual channel. The apparatus 600 of FIG. 6 can process multiple virtual channels, where a single data path processes different types of work items. An exit condition is used to determine if a work item is no longer needed. For example culling a graphic may be an exit condition. The number of buffer locations in each of the output buffer for BIN device 625, the output buffer for SU device 627, the output buffer for RASZ device 629, and the output buffer for IPA device 631 may be varied to match a bandwidth of up-stream or down-stream devices.

The BIN device 633 includes an input connected to the output of the output buffer for BIN device 625. The SU device 635 includes an input connected to the output of the output buffer for SU device 627. The RASZ device 637 includes an input connected to the output of the output buffer for RASZ device 629. The IPA device 639 includes an input connected to the output of the output buffer for IPA device 631.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a reservation logic device that receives a plurality of primitive types in a data pipeline, wherein the plurality of primitive types includes a binning (BIN) primitive and a setup (SU) primitive, wherein the BIN primitive is data concerning an element bound to a graphic function, and wherein an SU primitive is data concerning pipeline setup;
   a combinatorial logic device connected to the reservation logic device, wherein the combinatorial logic device is digital logic, and wherein an output of the combinatorial logic device is a Boolean function of inputs to the combinatorial logic device;
   an allocation logic device connected to the combinatorial logic device;
   a plurality of BIN buffers connected to the reservation logic device and the allocation logic device; and
   a plurality of SU buffers connected to the reservation logic device and the allocation logic device,
   wherein the allocation logic device determines whether a primitive type is allocated to a BIN buffer or a SU buffer,
   wherein the reservation logic device requests a reservation of one of the plurality of BIN buffers and the plurality SU buffers based on a corresponding indication of available BIN buffers and available SU buffers and the primitive type.

2. The apparatus of claim 1, wherein the combinatorial logic device determines whether to cull a corresponding BIN primitive or SU primitive.

3. The apparatus of claim 2, wherein the combinatorial logic device sends a reservation cancelation request a corresponding plurality of BIN buffers and plurality of SU buffers based on a corresponding culled BIN primitive or SU primitive.

4. The apparatus of claim 3, wherein the corresponding plurality of BIN buffers and plurality of SU buffers updates a corresponding number of available BIN buffers and available SU buffers based on the reservation cancelation request.

5. The apparatus of claim 1, wherein the reservation logic device allows a BIN primitive to proceed through the data pipeline when a corresponding number of available SU buffers is greater than zero.

6. The apparatus of claim 1, wherein the reservation logic allows the SU primitive to proceed through the data pipeline when a corresponding number of available SU buffers is greater than zero.

7. The apparatus of claim 1, wherein the plurality of reservation devices and the plurality of combinatorial logic devices are connected in an alternating and daisy-chain manner.

8. The apparatus of claim 1, wherein a number of buffers in the output buffer for BIN device and the output buffer for SU device is set to match a bandwidth of an up-stream device or a down-stream device.

9. The apparatus of claim 4, wherein the corresponding number of available BIN buffers and available SU buffers is determined based on a total number of buffers, a number of buffers containing valid data, and a number of reservations.

10. The apparatus of claim 7, wherein a number of BIN buffers or SU buffers corresponds to a number of BIN primitive/SU primitive devices.

* * * * *